(12) United States Patent
Chiu

(10) Patent No.: US 6,632,125 B2
(45) Date of Patent: Oct. 14, 2003

(54) METHOD OF MANUFACTURING ALUMINUM FRAMES FOR PHOTOMASK PROTECTIVE FILMS

(75) Inventor: Ming-Chien Chiu, Hsin Chuang (TW)

(73) Assignee: Gudeng Precision Industrial Co., Ltd., Taipei Hsien (TW)

( * ) Notice: Subject to any disclaimer, the term of this patent is extended or adjusted under 35 U.S.C. 154(b) by 14 days.

(21) Appl. No.: 09/956,150

(22) Filed: Sep. 20, 2001

(65) Prior Publication Data

US 2003/0054732 A1 Mar. 20, 2003

(51) Int. Cl.$^7$ ................................................. B24B 1/00
(52) U.S. Cl. .............................. 451/28; 451/29; 451/69; 451/70
(58) Field of Search ........................... 451/28, 29, 69, 451/70, 76

(56) References Cited

U.S. PATENT DOCUMENTS 3,610,117 A * 10/1971 Nash ........................... 493/21
6,171,175 B1 * 1/2001 Shaikh et al. .................. 451/28
6,416,396 B1 * 7/2002 Ganan ........................... 451/49
6,450,741 B1 * 9/2002 Cannelli, Jr. ................. 414/268

* cited by examiner

Primary Examiner—Lee D. Wilson
Assistant Examiner—Alvin J Grant
(74) Attorney, Agent, or Firm—Troxell Law Office PLLC

(57) ABSTRACT

A method of manufacturing aluminum frames for photomask protective films comprises the step of: providing a square-shaped hollow or solid strut aluminum material, fastening the bottom end of the aluminum material to a base of a machine tool, using a milling cutter to fabricate and form a hollow trough for a selected depth in the aluminum material from the top surface thereof, and using a cutting tool to cut off the aluminum material at the periphery of the hollow trough to form individual aluminum frames for the photomask protective films. The method of the invention uses fewer chucks and screw bolts during machining, and can reduce chuck setup time and simplify machining processes.

10 Claims, 4 Drawing Sheets

METHOD OF MANUFACTURING ALUMINUM FRAMES FOR PHOTOMASK PROTECTIVE FILMS

FIELD OF THE INVENTION

The present invention relates to a method of manufacturing aluminum frames for photomask protective films and particularly a method capable of manufacturing aluminum frames for photomask protective films with less chuck setups and simpler machining processes.

BACKGROUND OF THE INVENTION

Semiconductors and integrated circuits are widely used in people's life and work nowadays. For instance, they play critical roles in personal computers, cars, mobile phones, satellite communications, and household appliances.

Integrated circuits are clusters of specific electric circuits shrunk and built on a size about or smaller than 2 $cm^2$, and each contains thousands of individual solid state electronic elements that are visible only through microscopes. The solid state electronic elements also are called microelectronic elements.

Manufacturing of integrated circuits generally can be divided in three stages: 1. Manufacturing silicon chips; 2. Manufacturing integrated circuits; 3. Packaging the integrated circuits. Individual manufacturing processes include physical evaporation depositing, chemical evaporation depositing, micro photolithography, etching, diffusion, ion planting, oxidizing, heat treatment, etc. The micro photolithography is a critical process. The process includes coating a layer of photosensitive material on the chip surface, and projecting a parallel light through a photomask made of glass to the photosensitive material. The photomask has opaque patterns to block the light to allow the photosensitive material on the chip surface having selective exposure to form desired patterns on the photosensitive material on the chip surface. This is also called "exposing" process. The tools required to form the desired exposing patterns on the chip surface, besides the light source, also include a photomask for transferring the patterns. During the exposing process, in order to prevent dust from smearing the photomask and contaminate photosensitive material for the circuit pattern on the chip surface, the photomask usually is supported by an aluminum frame and bonded to a protective film on the surface. Through this setup, dust pollution and contamination on the pattern transfer can be minimized.

FIG. 1 shows a conventional aluminum frame for a photomask protective film. It has an aluminum frame 10 with a lower surface coating with adhesive for bonding a photomask 11. The upper surface of the aluminum frame 10 also is coated with adhesive for bonding a protective film 12. During exposing process, dust and debris 13 will fall on the protective film 12 without directly hitting the photomask 11, hence pattern transfer during exposing process will have minimum impact.

FIG. 2A illustrates a conventional machining method for fabricating the aluminum frames for photomask protective films. The method includes: stacking and positioning a plurality of aluminum sheets 20 (three layers have been shown in the drawing as an example) together; drilling selected number of holes through the aluminum sheets 20 (the hole number is dependent on the size of the aluminum sheet, usually four) for housing screw bolts 21 to fasten the aluminum sheets 20 to a base 22 of a machine tool to prevent the aluminum sheets from moving or dislocating during machining operations. The outer peripheral rims of the aluminum sheets 20 also are clamped by chucks 23 to hold the aluminum sheets 20 steadily and securely on the base 22.

Referring to FIG. 2B, during conventional machining processes, the aluminum sheets 20 (three layers in this example) are fastened to the base 22 of the machine tool, then a milling cutter 25 is deployed to perform milling operation along a selected path reciprocally. When the milling depth and profile have reached the required dimensions, dismantle the fastening screw bolts 24 and remove the chucks 23 to get the finished aluminum frames 10. Then disengage the screw bolts 21 to remove the remnant aluminum material 26. The finished aluminum frames 10 still need some other machining operations such as surface grinding and forming chamfer angles.

The machining method set forth above has a number of advantages:

1. Each aluminum sheet has to be aligned and drilled before milling operation, thus increasing the processing complexity.
2. While using screw bolts can increase fastening steadiness, it also takes more time and efforts to fasten and dismantle the screw bolts.
3. After milling operation, the aluminum frame still need surface grinding and chamfering processes, this requires additional fastening and machining operations. This further increases production costs.
4. The center portion of the aluminum sheet is useless and becomes a waste after machining processes.

SUMMARY OF THE INVENTION

In view of aforesaid disadvantages, the primary object of the invention is to provide an improved method of manufacturing aluminum frames for photomask protective films that require less chucks and screw bolts setup time, and has simpler machining processes thereby to achieve better production efficiency and save production costs.

Another object of the invention is to provide hollow aluminum material for machining to reduce excessive remnant of aluminum material.

To attain the foregoing objects, the method of the invention includes the steps of: selecting a square and strut-shaped aluminum material (solid or hollow), fastening the selected aluminum material to a base of a machine tool, milling the aluminum material to form a hollow trough with a selected depth according to required specifications and dimensions of the aluminum frame for forming a plurality of aluminum frames for photomask protective films, using a milling cutter which has multiple sloped chamfer surfaces to mill the hollow aluminum strut to become multiple layers with chamfer angles, using a cutter to cut off the aluminum strut at the perimeter to form an individual aluminum frame of a selected height, and grinding the cross section of the remaining hollow aluminum strut with a grinding tool, and separating and forming a plurality of individual aluminum frames from the aluminum strut by repeating the cutting and grinding processes.

In an embodiment of the invention, a solid or hollow aluminum square-shaped strut may be used for machining. When a hollow aluminum strut is being chosen, it has adequate thickness to withstand machining operations. The height of the aluminum strut is based on space limitation and steady requirements of machining. The bottom end of the aluminum strut may be drilled with a plurality of holes and taping with screw threads for fastening inversely to the base of the machine tool. Fastening the aluminum strut by chucks as the conventional techniques may also be adopted.

When the aluminum material is fastened to the milling machine or programmable center machine tool, milling cutters may be used to fabricate the outer and inner side of the aluminum material to a selected depth depending on the length of the cutters and machining steadiness requirements. When the outer dimensions are finished, use a special-made milling cutter for further machining. The special-made milling cutter has a plurality of spaced chamfer sloped surfaces formed axially with the interval of two neighboring sloped surfaces equal to the thickness of the aluminum frame. Hence the milling cutter may be used to cut the outer and inner side of the hollow strut to form layers of individual aluminum frames with desired chamfer angles.

After completing the foregoing processes, mount a server cutter to the machine tool such as a slitting cutter, an abrasive cutting wheel, or a saw to move around the periphery of the aluminum material to sever and form an individual aluminum frame. When a first aluminum frame is separated from the aluminum strut, use a grinding tool to grind the remaining cutting edge on the top end of the strut then sever a second aluminum frame. Repeat the processes to produce the aluminum frames until the aluminum strut is exhausted.

DETAILED DESCRIPTION OF THE INVENTION

The invention aims at providing a method of manufacturing aluminum frames for photomask protective films that includes less chuck setup operations and may be adapted for automatic production to reduce labor and time with simpler manufacturing processes. The invention can also be adapted for use in machining hollow aluminum material to reduce excessive remnant of aluminum material.

Figure 1:
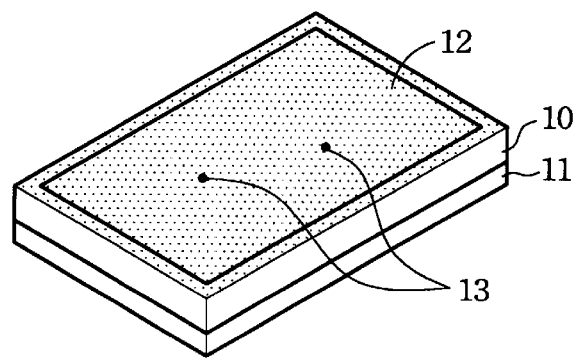
FIG. 1 a schematic perspective view of a conventional aluminum frame for photomask protective film.
Figure 2A:
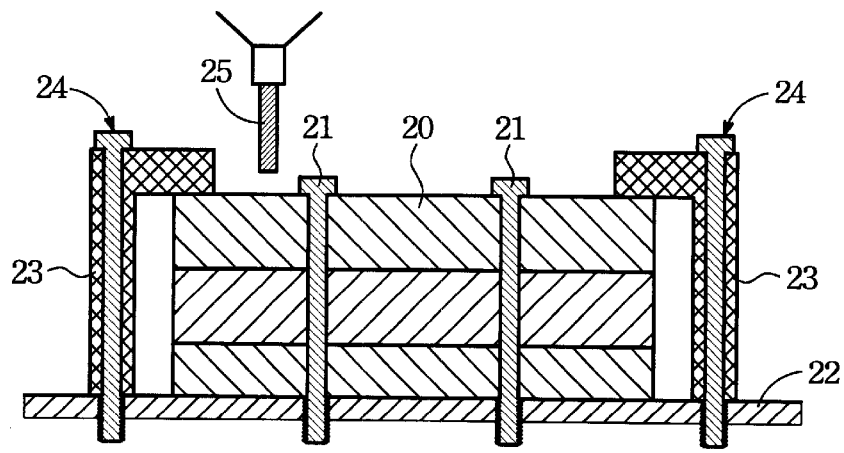
FIG. 2A is a schematic view of a conventional machining method for fabricating aluminum frames for photomask protective films.
Figure 2B:
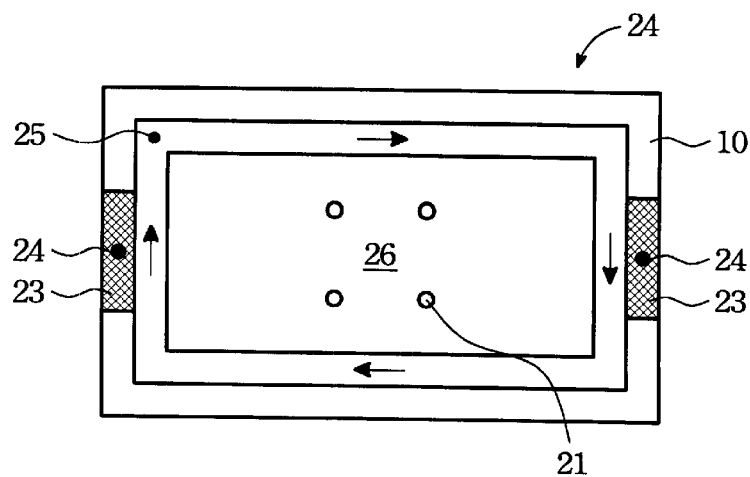
FIG. 2B is a schematic top view of a conventional machining method for fabricating aluminum frames for photomask protective films.
Figure 3:
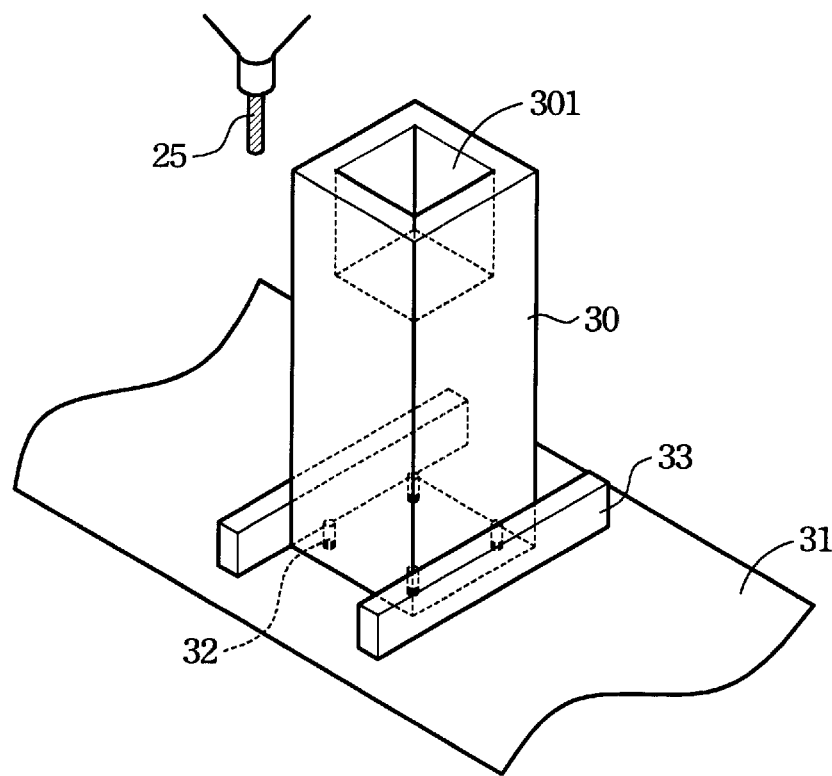
FIG. 3 is a schematic view of fastening a strut aluminum material to a base of a machining tool.

Referring to FIG. 3, a strut aluminum material 30 is fastened to a base 31 of a machine tool. The strut aluminum material 30 may be solid or hollow, and has a plurality of screw holes formed in the bottom end for inversely fastening to the base 31 of the machine tool through screw bolts 32 such that the strut aluminum material 30 will be positioned as required. When the wall of the strut aluminum 30 is too thin or other factors (such as the screw bolts 32 cannot be deployed on the base 31 of the machine tool), conventional chucks or vices may be used to hold and clamp the strut aluminum material 30.

The selected height of the strut aluminum material 30 must take into account the limitations of surrounding environments, such as height limitation between the base 31 and the milling cutter 25, the steady requirement for machining, etc. When machining is performed on a higher top end of the strut, the bottom end of the strut will bear a greater torque. Hence if the bottom end is not clipped firmly, or the working piece strength is not strong enough, the working piece will be loosened, shaken or deformed. It could even cause injury to people and damage to the machine tool.

Figure 4:
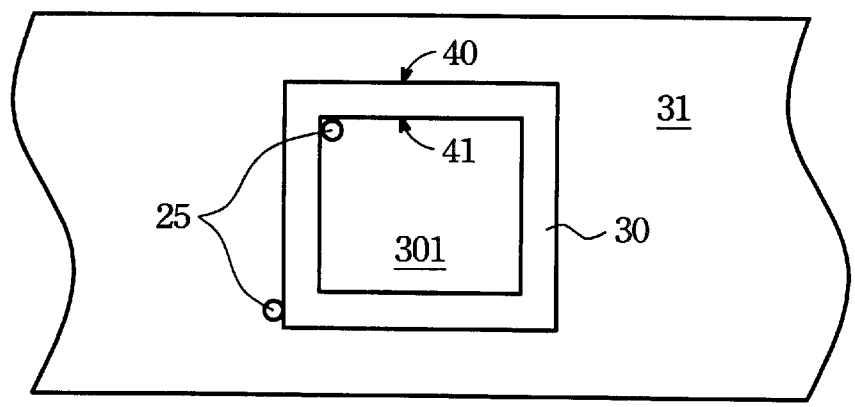
FIG. 4 is a schematic top view of a strut aluminum material under machining for forming exterior contour.

Referring to FIG. 4, when the strut aluminum material 30 is fastened, a milling cutter 25 may be deployed to perform milling operations on the exterior side 40 and interior side 41 of the strut aluminum material 30 to form a hollow trough 301 in the strut for a selected depth. The depth of the trough is dependent on the length of the milling cutter and steadiness of the working piece during machining. The depth of the hollow trough allows the strut aluminum to form a plurality of aluminum frames for photomask protective films. In general, the depth of the trough depends on the length of the milling cutter. However, the milling cutter being too long could result in greaterforce on the milling cutter and consequently produce less machining precision, or even cause damage or rupture of the milling cutter.

Figure 5A:
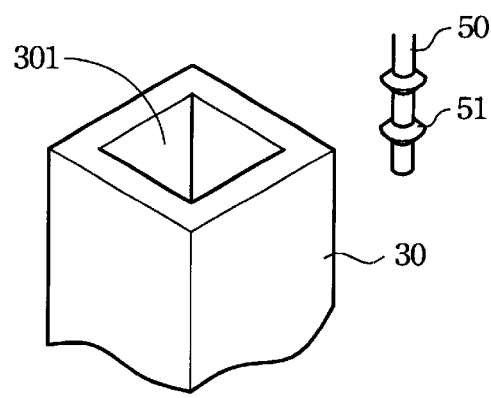
FIG. 5A is a schematic view of machining a hollow strut aluminum material with a special-made cutter for forming chamfer angles and layers.
Figure 5B:
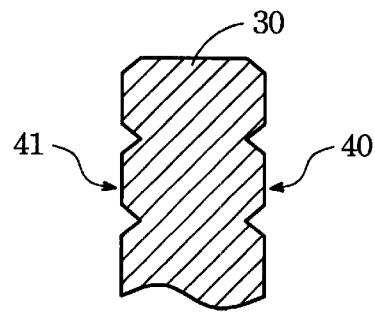
FIG. 5B is a fragmentary cross section of a hollow strut aluminum material wall after machining with the special-made cutter for forming chamfer angles and layers.

Referring to FIG. 5A, after machining of the contour of the hollow trough 301 is finished, use a special-made milling cutter 50 to perform the next step machining. The milling cutter 50 has a plurality of sloped chamfer surfaces 51 to cut the exterior side 40 and interior side 41 of the hollow trough 301 to form a plurality layers of chamfer angles as shown in FIG. 5B. The interval between two neighboring chamfer angles is equal to the height of the aluminum frame. Then a slitting cutter may be deployed to cut off the aluminum frame separately to form individual aluminum frames.

Figure 6:
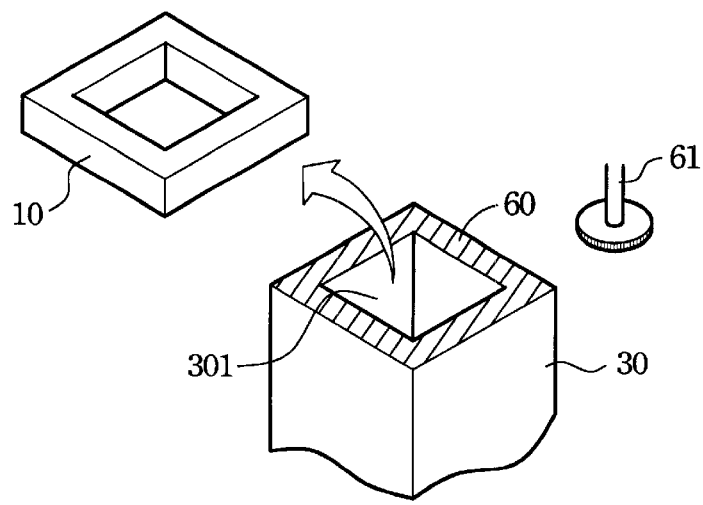
FIG. 6 is a schematic view of a cut off cross section of a remnant strut aluminum material ready for grinding.

The slitting cutter may also be an abrasive cutting wheel, saw or the like. Referring to FIG. 6, after a aluminum frame 10 is severed and removed from the hollow trough 301, the cross section 60 of the cutting edge on the strut aluminum material 30 could have an uneven surface. Then a grinding tool 61 may be deployed to grind the cutting edge surface to reach the flat and smooth conditions desired.

The aforesaid slitting and grinding processes may be repeated until the hollow trough 301 is exhausted. Then the top surface of the strut aluminum material 30 may be trimmed and ground again for the next cycle of machining operation until the whole aluminum material is used up.

The manufacturing method of the invention may be adapted to a programmable combined machine tool. Once the strut aluminum material 30 is positioned and fastened, and required cutting tools are setup on the rotary turret, the machining processes can be controlled by programs to proceed automatic production. Comparing with conventional techniques, the invention can save human labor, simplify manufacturing processes, fabricate automatically, and result in better controlled quality.

Figure 7:
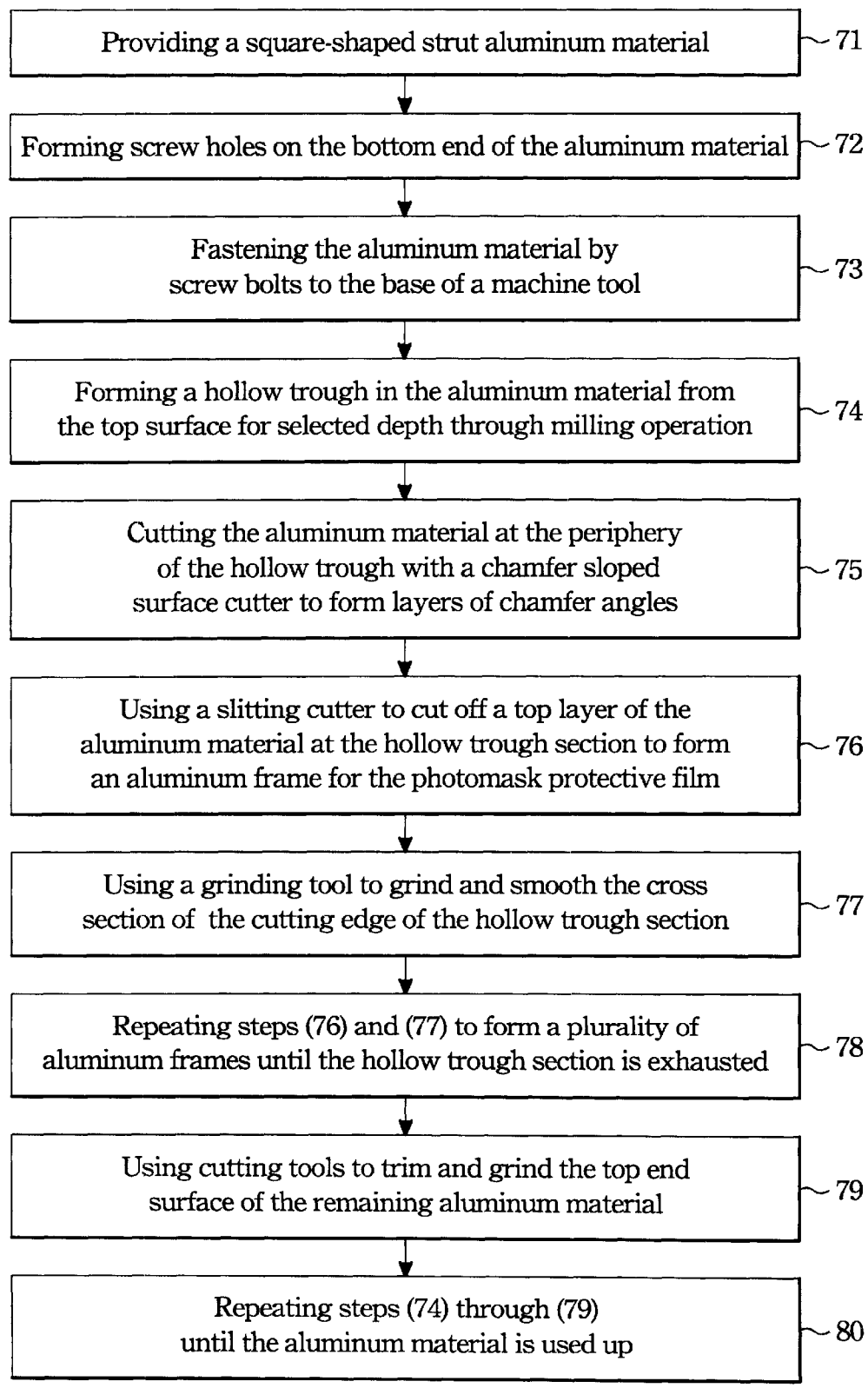
FIG. 7 is a manufacturing process flow chart of the invention.

FIG. 7 depicts the manufacturing process flow of the invention which includes the steps of: providing a square-shaped strut aluminum material (71), forming screw holes on the bottom end of the aluminum material (72), fastening the aluminum material by screw bolts to the base of a machine tool (73), forming a hollow trough in the aluminum material from the top surface for a selected depth through milling operation (74), cutting the hollow trough section with a chamfer sloped cutter to form layers of chamfer angles (75), using a slitting cutter to cut off the top layer of the hollow trough section to form an aluminum frame for photomask protective film (76), using a grinding tool to grind and smooth the cross section of the cutting edge of the hollow trough section as desired (77), repeating steps (76) and (77) to form a plurality of aluminum frames until the hollow trough section is exhausted (78), using cutting tools to trim and grind the top end surface of the aluminum material (79), repeating steps (74) through (79) until the aluminum material is used up (80).

While the preferred embodiment of the invention has been set forth for purpose of disclosure, modifications of the disclosed embodiment of the invention as well as other embodiments thereof may occur to those skilled in the art (such as matching the screws and screw bores, or screw bolts and screw nuts, or other connection means). Accordingly, the appended claims are intended to cover all embodiments which do not depart from the spirit and scope of the invention.

What is claimed is:

1. A method of manufacturing aluminum frames for photomask protective films, which comprises the steps of:
   a) providing a strut of aluminum material having a bottom and a top;
   b) fastening the aluminum material to a base of a machine tool;
   c) fabricating and forming a hollow trough at a preselected depth in the aluminum material from the top thereof using a milling cutter; and,
   d) cutting the aluminum material at a periphery of the hollow trough to form a plurality of individual aluminum frames for a photomask protective films using a cutting tool.

2. The method according to claim 1, wherein the providing step a) is carried out using a square-shaped solid aluminum material.

3. The method according to claim 1, wherein the providing step a) is carried out using a square-shaped hollow aluminum material.

4. The method according to claim 1, wherein the fastening step b) is carried out using screw holes formed on the bottom thereof for fastening the strut aluminum material to the base of the machine tool through screw bolts.

5. The method according to claim 3, wherein the fastening step b) is carried out by using a chuck.

6. The method according to claim 1, wherein the fastening step is carried out by fastening the aluminum material to a machine tool selected from the group consisting of a milling machine and a programmable combined machine tool.

7. The method according to claim 1, wherein the fabricating and forming step c) creates the hollow trough with a depth sufficient to form a plurality of aluminum frames for the photomask protective films.

8. The method according to claim 7, wherein the cutting step d) further comprises the step of forming layered and chamfer angles on the strut aluminum material through a multi-layer chamfer sloped surface milling cutter, before cutting off the aluminum material at the periphery of the hollow trough.

9. The method according to claim 1, wherein the cutting step d) is carried out by a cutting tool selected from the group consisting of an abrasive cutting wheel and a saw to the machine tool.

10. The method according to claim 1, wherein the cutting step d) further comprises the step of using a grinding tool to grind and smooth a cutting cross section formed on the top of the strut aluminum material before cutting a next layer of the aluminum frame to form the plurality of independent aluminum frames.

* * * * *